US006306216B1

United States Patent
Kim et al.

(10) Patent No.: US 6,306,216 B1
(45) Date of Patent: Oct. 23, 2001

(54) APPARATUS FOR DEPOSITION OF THIN FILMS ON WAFERS THROUGH ATOMIC LAYER EPITAXIAL PROCESS

(75) Inventors: Yong II Kim; Joong Ho Shin; Yeo Heung Yun, all of Dae Jeun Megacity (KR)

(73) Assignee: MooHan Co., Ltd., Seoul (KR)

( * ) Notice: Subject to any disclaimer, the term of this patent is extended or adjusted under 35 U.S.C. 154(b) by 0 days.

(21) Appl. No.: 09/614,718

(22) Filed: Jul. 12, 2000

(30) Foreign Application Priority Data

Jul. 15, 1999 (KR) .................................................. 99-28609

(51) Int. Cl.[7] .................................................. C23C 16/00
(52) U.S. Cl. .......................... 118/725; 118/715; 118/729; 118/730
(58) Field of Search .................................. 118/715, 725, 118/729, 730

(56) References Cited

U.S. PATENT DOCUMENTS

| | | | | |
|---|---|---|---|---|
| 4,981,722 | * | 1/1991 | Moller et al. | 427/248.1 |
| 5,281,274 | * | 1/1994 | Yoder | 118/697 |
| 5,338,362 | * | 8/1994 | Imahahi | 118/719 |
| 5,944,900 | * | 8/1999 | Tran | 118/715 |
| 6,001,183 | * | 12/1999 | Gurary et al. | 118/720 |
| 6,111,225 | * | 8/2000 | Ohkase et al. | 219/390 |

FOREIGN PATENT DOCUMENTS 1-305524 * 12/1989 (JP).

* cited by examiner

Primary Examiner—Richard Bueker
(74) Attorney, Agent, or Firm—McDermott, Will & Emery

(57) ABSTRACT

The present invention provides an apparatus for deposition of thin films on a plurality of wafers through an atomic layer epitaxial process within a reaction chamber. The apparatus has a susceptor, provided within the reaction chamber to hold the wafers and has of a plurality of wafer stations. A plurality of wafer seating units are provided in the wafer stations, and seat the wafers in the wafer stations. A gas ejecting unit is provided within the reaction chamber, and ejects reaction gases onto the reaction surfaces of the wafers. A gas feeding unit feeds the reaction gases to the gas ejecting unit at predetermined time intervals so as to allow the gas ejecting unit to alternately eject the reaction gases through each of two gas outlets into the reaction chamber. A susceptor drive unit rotates the susceptor at a predetermined velocity and vertically moves the susceptor to an upper optimal reaction position close to the ceiling of the reaction chamber. A vacuum pumping unit maintains pressure of the reaction gases within the reaction chamber, and discharges the reaction gases to the outside of the chamber. A wafer heating is positioned under the susceptor within the chamber, and heats the wafers on the susceptor within the chamber, and heats the wafers on the susceptor to a predetermined temperature. A plurality of chamber heaters are regularly set within the reaction chamber in a radial direction, and heat the interior.

9 Claims, 8 Drawing Sheets

APPARATUS FOR DEPOSITION OF THIN FILMS ON WAFERS THROUGH ATOMIC LAYER EPITAXIAL PROCESS

BACKGROUND OF THE INVENTION

1. Field of the Invention

The present invention relates to a thin film deposition apparatus used in a process of producing semiconductor devices and, more particularly, to an apparatus for deposition of thin films on a plurality of wafers through an atomic-epitaxial process within a reaction chamber, the apparatus being added with a plurality of units, such as a gas supply unit, a wafer heating unit and a gas discharging unit, thus improving productivity while producing semiconductor devices.

2. Description of the Prior Art

As well known to those skilled in the art, a conventional process of producing semiconductor devices comprises a wafer formation step, an epitaxy step, a thin film deposition step, a diffusion/ion-implantation step, a photolithography step and an etching step. That is, in order to produce desired semiconductor devices, a wafer is primarily formed from a polycrystalline silicon ingot made of a siliceous material, such as sand. A single crystalline film is formed on the wafer through an epytaxy step. Thereafter, a variety of thin films are formed on the wafer in accordance with desired use of resulting semiconductor devices prior to performing a diffusion/ion-implantation step. After the diffusion/ion-implantation step, the wafer is cut into a plurality of semiconductor chips. The chips are, thereafter, packaged by a plastic packaging material, thus forming desired semiconductor devices.

In the process of producing semiconductor devices, at least one film is formed on the wafer at every step. Such films, formed on the wafer during the process of producing semiconductor devices, are generally classified into four films: an oxide film ($SiO_2$) typically used as a gate oxide film or a field oxide film, a nitride film ($Si_3N_4$) typically used as an insulation film between conductive layers, a mask during a diffusion/ion-implantation step or a device protection film, a polycrystalline silicon layer typically used as a gate electrode in place of a metal film, and a metal film used as a conductive film connecting the devices together or connected to external terminals. Of course, it should be understood that the above-mentioned classification of the films into four types is not intended to limit the classification of such films.

In the prior art, a CVD (chemical vapor deposition) process has been-preferably used for forming an oxide film and a nitride film on a wafer. In such a CVD process, a plurality of wafers are positioned within a reaction chamber and a reaction gases are applied to the reaction surfaces of the wafers. The gases are thus vapor-deposited on the reaction surfaces of the wafers and form desired thin films on the reaction surfaces of the wafers. Such a CVD process is preferably used for accomplishing a deposition of thin films on wafers. Conventional CVD processes are classified into several types: an atmospheric CVD process, a reduced pressure CVD process, a plasma CVD process and an energy step-up CVD process. Regardless of the types of CVD processes, it is necessary to control the CVD processes so as to form a film having less impurities and a constant thickness on a target wafer.

A desired polycrystalline silicon film is formed on a wafer by thermally decomposing silane ($SiH_4$) and vapor-depositing Si on the wafer within a reaction chamber. On the other hand, a desired metal film is formed on a wafer through a sputtering process or a CVD process. When such a CVD process is used for vapor deposition of such a metal film on a wafer, it is possible to accomplish high quality step coverage and a constant thickness of the resulting metal film and to form desired metal films on the reaction surfaces of a plurality of wafers at the same time.

The thin film deposition process is a very important process. In addition, the thin film deposition process is not performed only once during a process of producing semiconductor devices, but is repeatedly and necessarily performed at every step. Therefore, the thin film deposition technique has been actively studied to accomplish desired high quality film characteristics. As a result of such an active study, an apparatus, designed to deposit desired thin films on target wafers by positioning the wafers within a vacuum reaction chamber and by applying reaction gases to the reaction surfaces of the wafers within the reaction chamber, is proposed and preferably used.

An atomic layer epitaxy process undesirably reduces the processing speed during a process of producing semiconductor devices, thus being less likely to be used in the semiconductor device production process in the prior art. However, since the atomic layer epitaxy process can effectively accomplish a low impurity concentration and form high quality thin films on wafers, it has been actively studied to be preferably used in the semiconductor device production process. For example, a conventional thin film deposition apparatus used in such an atomic layer epitaxy process is shown in FIG. 1. As shown in the drawing, the thin film deposition apparatus comprises a gas supply unit 1 and a susceptor 3. The susceptor 3 is positioned within a vacuum chamber 4 and holds a plurality of wafers 2 thereon. The above apparatus performs a desired atomic layer epitaxy process for the wafers 2 using reaction gases supplied from the gas supply unit 1. However, the above apparatus is problematic in that it performs the desired atomic layer epitaxy process for only one wafer at a time, and so it is necessary to feed and return the wafers one by one.

This finally reduces the processing speed of the deposition process and reduces the number of wafers. For example, U.S. Pat. No. 5,338,362 of Imahashi discloses an apparatus for forming a CVD film on semiconductor wafers. This apparatus includes a cylindrical vacuum chamber, a plurality of partitioned wafer stations, and a table used as a susceptor supporting a plurality of wafers thereon. This apparatus also includes a vacuum pump and a motorized shaft for rotating the table, a lifter vertically moving the table in opposite directions, a gas supply system provided with a gas supply inlet for feeding reaction gases into the vacuum chamber, and a wafer heater for heating the wafers.

U.S. Pat. No. 5,218,274 of Yoder discloses an apparatus and method of growing thin films of the elemental semiconductors (group IVB) using modified atomic layer epitaxial (ALE) growth techniques. This apparatus includes a vacuum chamber, a plurality of server chambers seating wafers therein, a susceptor seating the wafer thereon, a vacuum pump assembly, a motorized shaft rotating the susceptor, a reaction gas supply pipe, a tail pipe connected to the reaction gas supply pipe, a plurality of gas inlets formed on the tail pipe and ejecting reaction gases into the vacuum chamber, and a wafer heater for heating the wafers.

U.S. Pat No. 6,111,225 of Ohkase discloses a thermal processing apparatus for a semi-conductor wafer. This apparatus includes a processing chamber, an upper gas supply pipe, a wafer holder, a claw support assembly mounted to the wafer holder, a support shaft connected to the wafer holder, a motor used for rotating the wafer holder, a heater used for heating a substrate, an inert gas supply pipe used for directing reaction gases to the heater. The apparatus also has a peripheral heater ring.

However, the above-mentioned three conventional apparatuses are problematic as follows. That is, the three conventional apparatuses are designed to only seat the wafers on the stations of a table within a processing chamber, supply reaction gases to the wafers within the chamber, and/or heat the wafers. Therefore, it is almost impossible for the apparatuses to achieve desired temperature conditions required to allow a desired deposition of reaction gases on the wafers, form uniform thin films on the wafers, or perform a quick process while controlling the thickness of the thin films deposited on the wafers.

SUMMARY OF THE INVENTION

Accordingly, the present invention has been made keeping in mind the above problems occurring in the prior art, and an object of the present invention is to provide an apparatus for deposition of thin films on a plurality of wafers through an atomic layer epitaxial process within a reaction chamber, of which the reaction chamber is capable of processing a plurality of wafers through an atomic layer epitaxy process at the same time, and which has a means for supplying reaction gases into the reaction chamber, a means for rotating and moving the wafers within the reaction chamber, and a means for keeping a desired constant temperature of the wafers within the reaction chamber during a thin film vapor deposition process.

Another object of the present invention is to provide an apparatus for effective deposition of thin films on a plurality of wafers through an atomic layer epitaxial process within a reaction chamber, which is designed to increase the production yield of semiconductor wafers and to form high quality thin films on the wafers while producing desired wafers through an atomic layer epitaxy process, and which automatically performs a desired vapor deposition process of forming thin films on a plurality of wafers, and has a means for uniformly ejecting gases into the reaction chamber, thus lengthening the expected life span of the reaction chamber, and which is designed to alternately feed reaction gases into the reaction chamber, thus appropriately controlling the quality of thin films formed on the wafers as desired, and which is provided with a purging function at its gas supply unit and independently controls the temperature of a wafer heating unit at two parts, and which is provided with heaters at the upper and side portions within the reaction chamber, thus optimally controlling the reaction atmosphere within the reaction chamber.

In order to accomplish the above objects, the present invention provides an apparatus for deposition of thin films on a plurality of wafers through an atomic layer epitaxial process within a sealed reaction chamber, comprising: a susceptor provided within the reaction chamber, to hold the wafers thereon, the susceptor consisting of a plurality of wafer stations installed within the reaction chamber and used for holding the wafers respectively thereon such that reaction surfaces of the wafers are exposed to the interior of the reaction chamber, and a plurality of wafer seating units provided in the wafer stations respectively while penetrating the stations and being movable upward and downward in a vertical direction relative to the stations so as to seat the wafers in the wafer stations; a gas ejecting unit provided at an upper portion of and within the reaction chamber, and adapted for ejection reaction gases onto the reaction surfaces of the wafers within the reaction chamber; a gas feeding unit maintaining a predetermined temperature of the gases and feeding the reaction gases to the gas ejecting unit at predetermined time intervals so as to allow the gas ejecting unit to alternately eject the reaction gases into the reaction chamber; a susceptor drive unit adapted for rotating the susceptor at a predetermined velocity and vertically moving the susceptor to an upper optimal reaction position close to a ceiling of the reaction chamber; a vacuum pumping unit adapted for maintaining pressure of the reaction gases within the reaction chamber at a predetermined pressure, and discharging the reaction gases from the reaction chamber to the outside of the reaction chamber; a wafer heating unit positioned at a position under the susceptor within the reaction chamber, and used for heating the wafers held on the susceptor at a predetermined constant temperature; and a reaction chamber heating unit consisting of a plurality of chamber heaters regularly set within the reaction chamber in a radial direction, and heating the interior of the reaction chamber at a predetermined constant temperature.

The wafer seating unit comprises: a lift plate having a flat upper surface; a plurality of wafer moving pins assembled with the lift plate and regularly spaced apart from each other at predetermined angular intervals, the wafer moving pins commonly coming into contact with one wafer; and a lift plate drive unit mounted to the lift plate so as to move the lift plate in a vertical direction.

The gas supply unit comprises: a gas ejection unit provided at an upper portion within the reaction chamber for ejecting the reaction gases onto the wafers within the reaction chamber; and a gas feeding unit used for feeding the reaction gases to the gas ejection unit.

In addition, the gas feeding unit comprises: a first gas feeding pipeline consisting of: a first container receiving a first liquid reaction gas source; a first gas inlet pipe introducing inert gas into the first container; a first gas outlet pipe discharging reaction gas formed by an evaporation of the first liquid reaction gas source reacted with the inert gas introduced into the first container; and a first branch pipe branched from the first gas inlet pipe and joining the first gas outlet pipe; and a second gas feeding pipeline consisting of: a second container receiving a second liquid reaction gas source; a second gas inlet pipe introducing inert gas into the second container; a second gas outlet pipe discharging reaction gas formed by an evaporation of the second liquid reaction gas source reacted with the inert gas introduced into the second container; and a second branch pipe branched from the second gas inlet pipe and joining the second gas outlet pipe.

Each of the first and second gas outlet pipes is branched into a pipe extending to the reaction chamber and another pipe extending to a pump, with a pipe heating part being provided in each of the first and second gas outlet pipes for preheating the pipe, extending to the reaction chamber, to a predetermined temperature. A plurality of check valves and pneumatic valves are mounted on the first and second pipelines at positions between the first gas inlet pipe and the first container, between the first gas outlet pipe and the reaction chamber, between the second gas inlet pipe and the second container, and between the second gas outlet pipe and the reaction chamber, with a gas pressure controlling orifice being mounted at a position between each of the first and second gas outlet pipes and an associated pump.

A carrier pipe extends from an integrated inlet of the first and second gas inlet pipes to an integrated outlet of the first and second gas outlet pipes so as to directly feed the reaction gases into the reaction chamber. The above gas supply unit is controlled to allow the reaction gases of the first and second gas outlet pipes to be alternately ejected into the reaction chamber. When any one of the first and second gas outlet pipes does not allow a flow of reaction gas through it, inert gas flows in an associated one of the first and second branch pipes, thus purging the interior of an associated one of the first and second gas outlet pipes extending to the reaction chamber.

In the apparatus, the wafer heating unit comprises a plurality of halogen lamp heaters concentrically installed on a surface of the susceptor, the halogen lamp heaters being controlled independently; and an inert gas ejection unit installed at a position around the halogen lamp heaters to intermittently eject inert gas to the halogen lamp heaters, thus preventing an undesirable surface contamination of the halogen lamp heaters.

BRIEF DESCRIPTION OF THE DRAWINGS

The above and other objects, features and other advantageous of the present invention will be more clearly understood from the following detailed description taken in conjunction with the accompanying drawings, in which:

FIG. 3b is a sectional view of the susceptor taken along line A—A of FIG. 3a;

FIG. 4b is a sectional view of the portion "B" of FIG. 4a;

DETAILED DESCRIPTION OF THE INVENTION

Figure 1:
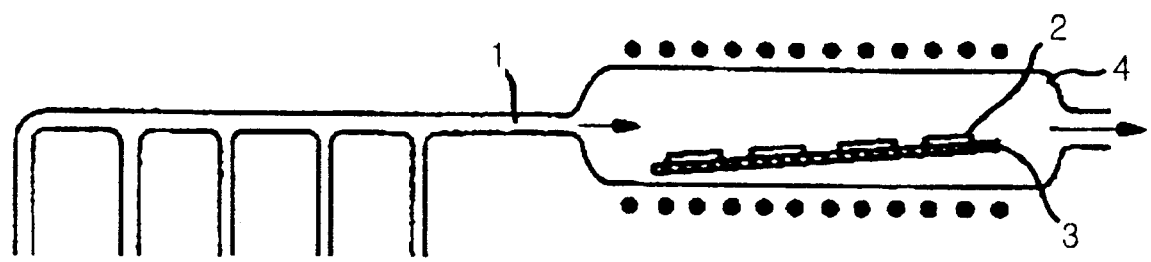
FIG. 1 is a view of a conventional apparatus for deposition of thin films on wafers.
Figure 2:
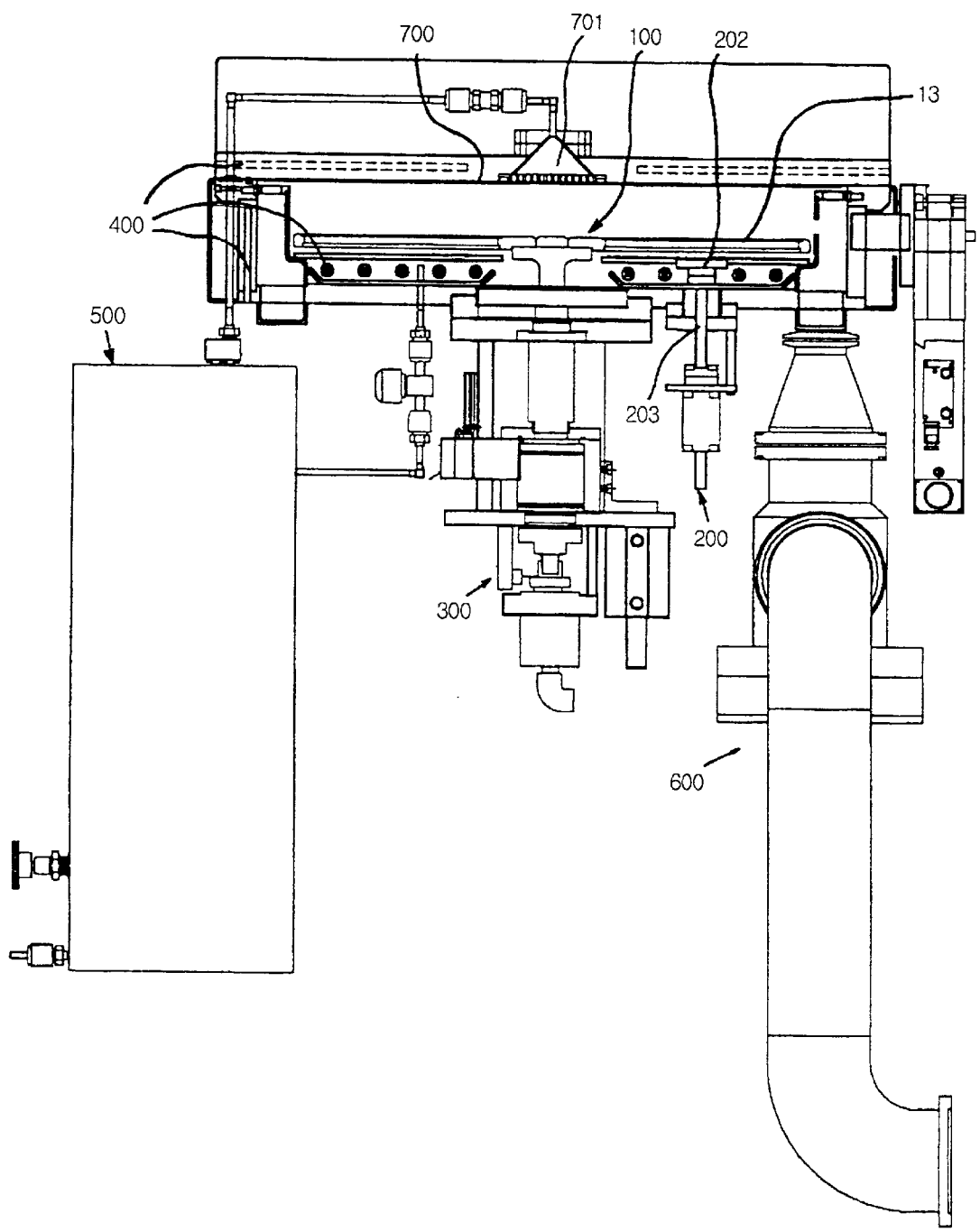
FIG. 2 is a view, showing the construction of an apparatus for deposition of thin films on wafers in accordance with the preferred embodiment of the present invention.

FIG. 2 is a view, showing the construction of an apparatus for deposition of thin films on wafers through an atomic layer epitaxy process in accordance with the preferred embodiment of this invention. As shown in the drawing, the apparatus of this invention comprises a susceptor 100, which is provided within a reaction chamber and consists of a plurality of wafer stations for holding a plurality of wafers, fed by a wafer feed unit (not shown), in a way such that the reaction surfaces of the wafers are exposed to the interior of the reaction chamber. The apparatus also has a wafer seating unit 200, which is provided in each wafer station of the susceptor 100 and moves a wafer, fed by a robot arm (not shown), upwardly and downwardly in a vertical direction so as to seat the wafer in an associated wafer station of the susceptor 100. The apparatus further comprises a susceptor drive unit 300, a heating unit 400, a vacuum pumping unit 600, and a gas supply unit. The susceptor drive unit 300 rotates the wafers of the susceptors 100 at a predetermined velocity vertically and moves the susceptor 100 between an upper optimal reaction position and a lower position relative to the ceiling of the reaction chamber. The heating unit 400 heats the reaction surfaces of the wafers and the reaction chamber at a constant temperature, thus allowing at least one of the reaction surfaces of the wafers and the reaction chamber to accomplish a predetermined temperature condition of reaction gases. The vacuum pumping unit 600 maintains the pressure of the reaction gases within the reaction chamber at a predetermined pressure, and maintains the interior of the reaction chamber at a low vacuum state expected from the chamber before the vapor deposition process. The gas supply unit, consisting of a gas feeding unit 500 and a gas ejection unit 701, supplies the reaction gases to the reaction surfaces of the wafers within the reaction chamber. Of the gas supply unit, the gas ejection unit 701 is installed at the upper portion within the reaction chamber while being directed downwardly and ejects reaction gases to the wafers held on the susceptor 100, while the gas feeding unit 500 feeds reaction gases to the gas ejection unit 701.

The wafer feed unit, which is not shown in the drawings, is positioned outside the reaction chamber and has a wafer feed robot that picks up the wafers outside the chamber and feeds the wafers into the reaction chamber one by one. In the preferred embodiment of the invention, the wafer feed unit is designed to horizontally feed the wafers into a sidewall of the reaction chamber. Such a wafer feed unit is well known to those skilled in the art and further explanation for the construction of the wafer feed unit is thus not deemed necessary.

Figure 6:
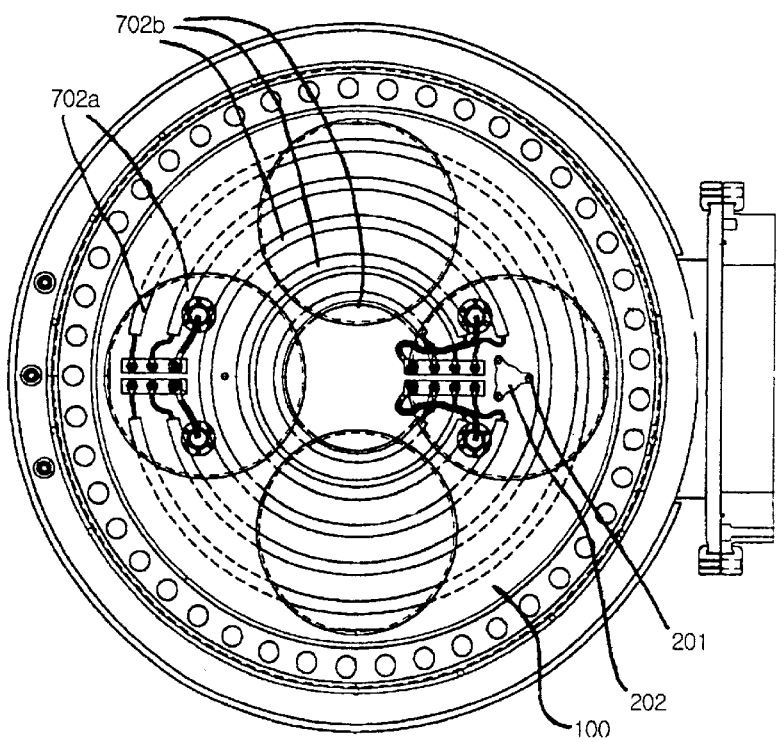
FIG. 6 is a plan view of both the susceptor and a wafer-heating unit of the thin film deposition apparatus according to the present invention.

FIG. 2 also shows a structure for loading the wafers 13, fed into the reaction chamber 11 by the wafer feed unit, on the susceptor 100. When a wafer 13 is fed into the reaction chamber 11 by the robot arm of the wafer feed unit, the wafer seating unit 200, provided in the first station of the susceptor 100 and comprised of an actuation cylinder, primarily receives the wafer 13. In such a case, the wafer seating unit 200 comprises a lift plate 202, having a flat upper surface, and three wafer moving pins 201, integrated with the lift plate 202 as shown in FIG. 6. The three wafer moving pins 201 used for vertically moving wafer in opposite direction are regularly spaced apart from each other at predetermined angular intervals and are positioned to commonly come into contact with one wafer 13. At any rate, the three wafer moving pins 201 of the wafer seating unit 200 move upwardly along with the lift plate 202 and allow the lift plate 202 to receive the wafer 13 from the robot arm. When the wafer 13 is completely moved from the robot arm to the lift plate 202, the robot arm is removed from the vacuum reaction chamber to the outside of the chamber. The lift plate 202 is, thereafter, moved downwardly while holding the wafer 13 thereon and seats the wafer 13 in the first station of the susceptor 100. After the wafer 13 is seated in the first station of the susceptor 100, the lift plate 202 is further moved downwardly to a position under the susceptor 100, thus allowing the susceptor 100 to be rotatable. At the position under the susceptor 100, the lift plate 202 can receive a new wafer 13 from the robot arm. In such a case, the vertical movement of the lift plate 202 is accomplished by a lift plate drive unit 203, which is mounted to the lower surface of the lift plate 202 and moves the lift plate 202 in a vertical direction. When one wafer 13 is completely seated in the first station of the susceptor 100, the susceptor 100 is rotated at an angle of 90°, thus accomplishing a second position for seating a next wafer 13 in a second station. When the susceptor 100 is rotated to accomplish the second position for seating the next wafer 13 in the second station, the above-mentioned process of seating the wafer 13 on the susceptor 100 is repeated. The above-mentioned wafer seating process is continuously repeated until four wafers 13 are completely held on the first to fourth stations of the susceptor 100.

Figure 3A:
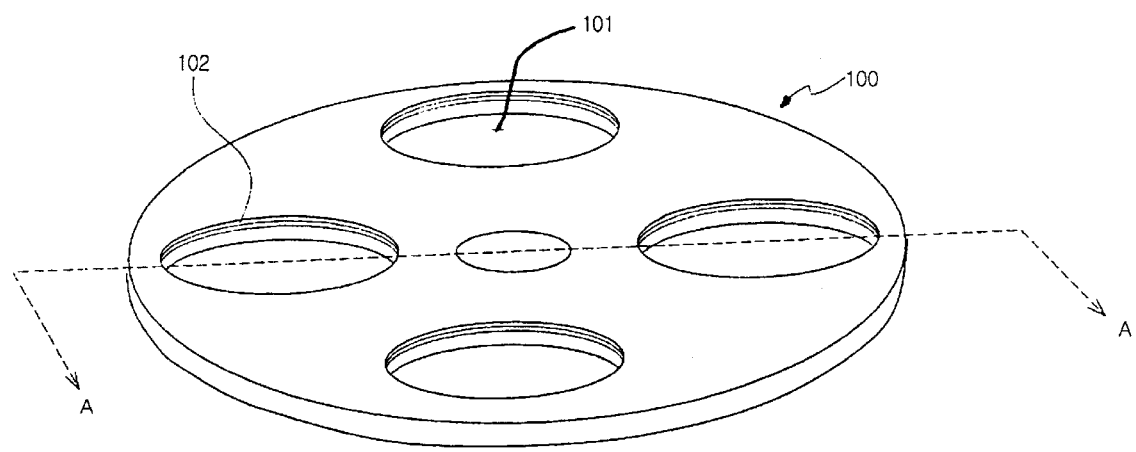
FIG. 3a is a perspective view of a susceptor included in the thin film deposition apparatus of this invention
Figure 3B:
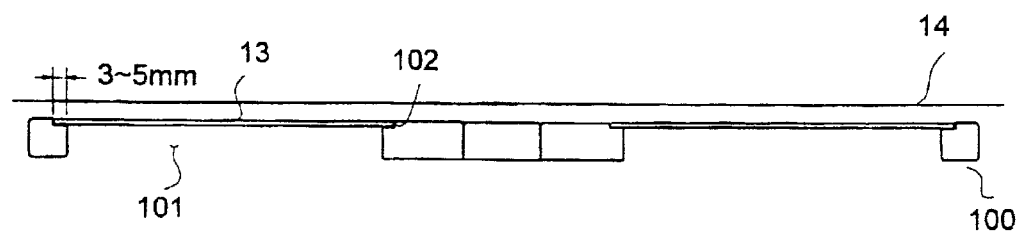

In the present invention, the susceptor 100 is preferably made of a metal or a ceramic material, such as SiC. In such a case, it is possible to select the material of the susceptor 100 from metal materials and ceramic materials in accordance with a selected material for the electronic device. As shown in FIGS. 3a and 3b, the susceptor 100 is designed to have a circular profile and to seat four wafers 13, individually having a diameter of at least six inches, on the wafer stations 101. That is, the circular susceptor 100 has four wafer stations 101, each of which is provided with an annular step along its circular edge, thus stably seating the edge of a wafer 13 and preventing an undesirable movement of the wafer 13 in the station 101. The step of each station 101 is best seen in FIG. 3b. In order to align the position of each wafer station 101 with the lift plate 202, the susceptor 100 is precisely rotated by the susceptor drive unit 300, consisting of a drive motor.

The above susceptor drive unit 300 may index-rotate the susceptor 100 at a regular interval so as to seat the wafers 13 in the designated wafer stations 101 of the susceptor 100 or simply rotate the susceptor 100, or move the wafers 13 upwardly to the upper portion within the reaction chamber as desired during an operation of the apparatus.

As shown in FIG. 3b, each of the wafer stations 101 is provided with an annular step along its circular edge. In such a case, the annular step of each station 101 has a diameter, which is smaller than that of each wafer by 3 mm to 5 mm, and so the edge of the wafer 13 is stopped by the vertical surface portion of the annular step and is stably seated on the horizontal surface,portion of the step. It is thus possible to precisely install each wafer 13 on a designated station of the susceptor 100. The height of the vertical surface portion of the annular step is determined to be equal to the thickness of each wafer 13, and so the reaction surface of the wafer 13 is not positioned lower than the surface of the land of the susceptor 100 when the wafer 13 is appropriately seated in a designated station 101. Therefore, it is possible to allow the reaction gases to smoothly flow on the reaction surfaces of the wafers seated in the stations 101 of the susceptor 100 and uniformly form a desired thin film on the reaction surface of each wafer 13 during a vapor deposition process of the apparatus.

When the wafers 13 are completely seated in the stations of the susceptor 100, the susceptor drive unit 300 moves the susceptor 100 upwardly, thus allowing the wafers 13 to be positioned close to the reaction gases ejected from the gas ejection unit 701. Such a movement of the susceptor 100 performed by the susceptor drive unit 300 is schematically shown in FIG. 3b. In FIG. 3b, the reference numeral 14 denotes the ceiling of the reaction chamber. The susceptor drive unit 300 moves the susceptor 100 upwardly until the reaction surfaces of the wafers 13, seated in the stations 101 of the susceptor 100, are positioned close to the ceiling 14 with a desired gap of 2 mm~5 mm being formed between the reaction surface of each wafer 13 and the ceiling 14. During a vapor deposition process of the apparatus, the reaction gases flow within the gap while forming a desired thin film on the reaction surface of each wafer 13. Such a vapor deposition process will be described in more detail later herein in conjunction with FIG. 4b.

In the apparatus of this invention, the gap, formed between the reaction surface of each wafer 13 and the ceiling 14, is controllable by a vertical movement of the susceptor drive unit 300. As described above, the susceptor drive unit 300 is designed to be rotatable in addition to being movable in a vertical direction.

Figure 4A:
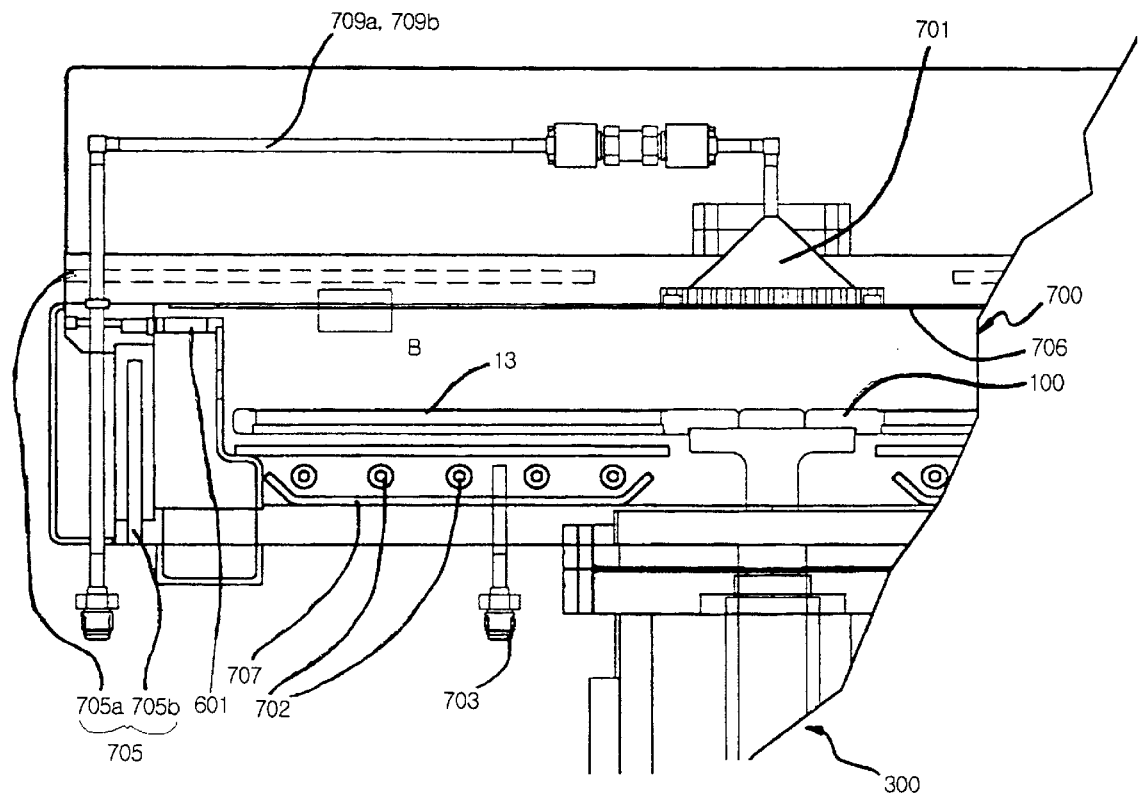
FIG. 4a is a sectional view, showing the construction of both a reaction chamber and parts around the chamber of the apparatus according to the present invention.
Figure 4B:
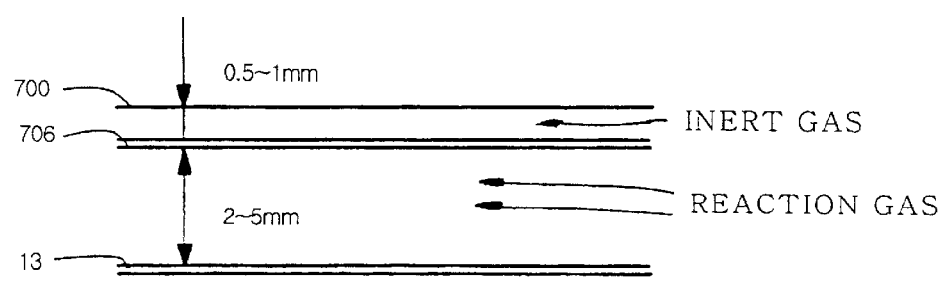

FIG. 4a is a sectional view, showing the construction of the reaction chamber 700 of this invention. FIG. 4b is a sectional view of the portion "B" of FIG. 4a. As shown in the drawings, the reaction chamber 700 comprises the susceptor 100 for seating a plurality of wafers thereon and the gas ejection unit 701 for ejecting the reaction gases into the reaction chamber 700. The reaction chamber 700 also has a wafer heating unit 702 and a reaction chamber heating unit 705. The wafer heating unit 702 is positioned at the lower portion within the chamber 700 and heats the wafers 13 held on the susceptor 100 at a predetermined constant temperature. The reaction chamber heating unit 705 is radially positioned within the housing of the reaction chamber 700, and heats the interior of the chamber 700 at a predetermined constant temperature. The reaction chamber 700 also has the susceptor drive unit 300, which seats the wafers on the susceptor 100 and rotates the susceptor 100 in addition to moving the susceptor 100 in a vertical direction. In the present invention, a halogen lamp heater is preferably used as the wafer heating unit 702. An inert gas ejection unit 703 is installed at a position around the wafer heating unit 702 to prevent an undesirable contamination of the halogen lamp of the wafer heating unit 702 due to the reaction gases. A plurality of pumping holes 601 are formed at the peripheral portion of the reaction chamber 700 to discharge post-process reaction gases from the interior of the chamber 700.

Figure 5:
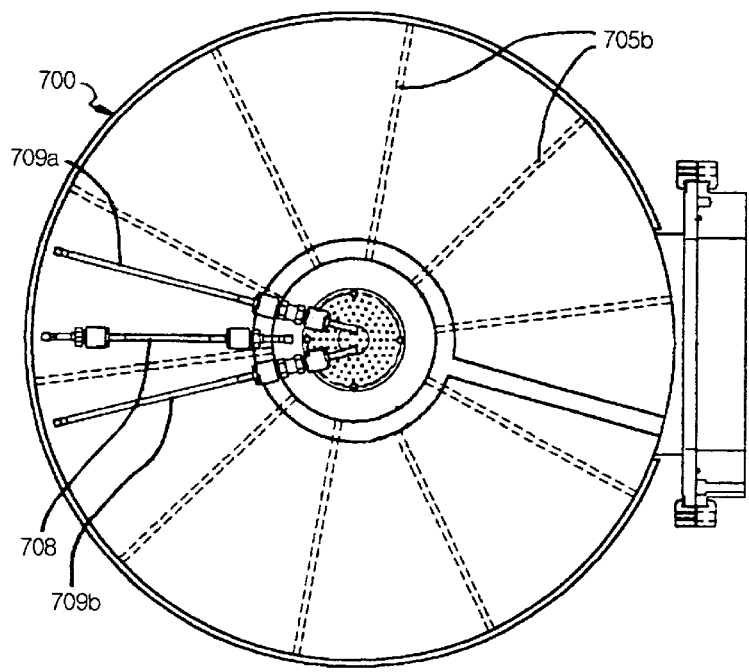
FIG. 5 is a plan view of the reaction chamber of the thin film deposition apparatus according to the present invention.

The reaction chamber heating unit 705 comprises a first chamber heater 705a and a second chamber heater 705b which are regularly set within the housing of the reaction chamber 700 in a radial direction. The first chamber heater 705a is used for heating the sidewall of the reaction chamber 700 at a desired constant temperature, while the second chamber heater 705b is used for heating the upper portion of the reaction chamber 700 at a desired constant temperature. The reaction chamber heating unit 705, used for heating the reaction chamber 700 to a temperature of 300° in accordance with use of the reaction gases, is formed by an installation of cartridge-type heaters at the upper and lower portions within the reaction chamber 700. As shown in FIG. 5, the second chamber heater 705b is radially positioned in order to uniformly heat the reaction chamber. The above reaction chamber 700 is preferably made of aluminum having a high conductivity or stainless steel resisting the corrosive gases.

Figure 9A:
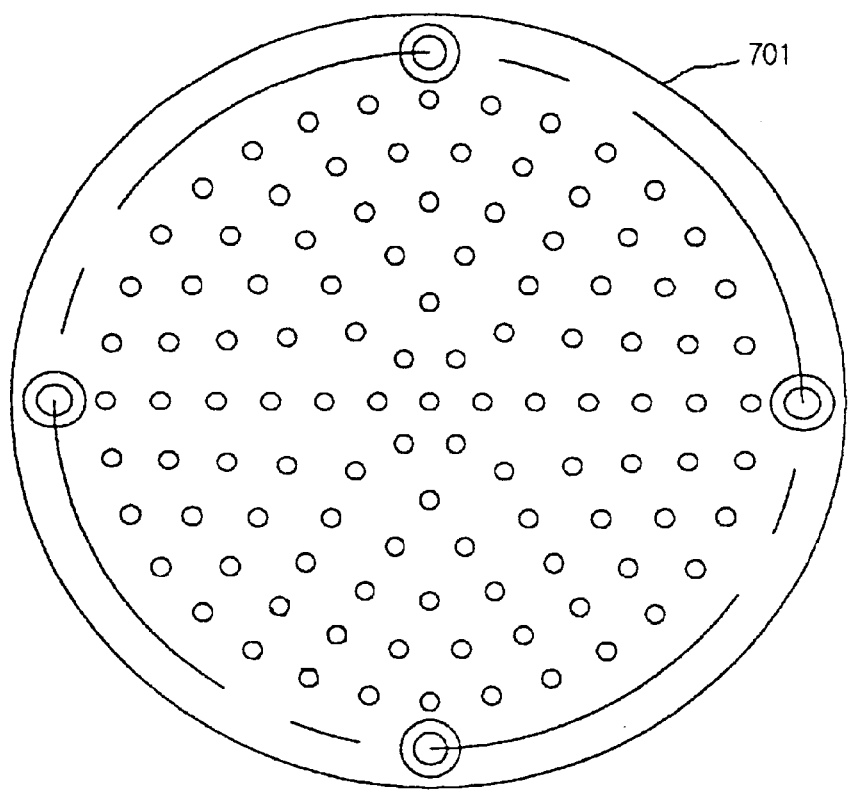
FIGS. 9a and 9b are a bottom view and a sectional view of a gas ejection unit of this invention.
Figure 9B:

The halogen lamp heater 702 is used for heating the wafers 13 to accomplish a desired processing condition. The construction and operation of the halogen lamp heater 702 will be described in more detail later herein with reference to FIG. 6. A dish-shaped reflection plate 707 is installed at a position under the halogen lamp heater 702 to improve the heat transferring efficiency. As shown in FIGS. 9a and 9b, the gas ejection unit 701 comprises a plurality of nozzles, which are installed to uniformly eject reaction gases into the reaction chamber 700.

The inert gas ejection unit 702 ejects inert gases in a reverse direction so as to prevent the reaction gases from flowing to a position around the halogen lamp heater 702, thus preventing an undesirable contamination of the surface of the halogen lamp heater 702 due to the reaction gases. The above halogen lamp heater 702 is a heater designed to generate convection heat using light, and so the heater 702 is remarkably reduced in its thermal efficiency when it is contaminated at its surface.

The construction and operation of the pumping holes 601 will be described in more detail later herein in conjunction with FIGS. 7a and 7b.

FIG. 4b is an enlarged view of the portion "B" of FIG. 4a. This drawing shows a shield 706, which is installed while being spaced apart from the ceiling surface of the reaction chamber 700, with a gap of 0.1 mm~1 mm being formed between them. The wafers 13 are positioned under the shield 706 while being spaced apart from the shield 706 with a gap of 2 mm~5 mm being formed between them. During a vapor deposition process of the apparatus, reaction gases flow within the gap between the wafers 13 and the shield 706 while forming a desired thin film on the reaction surface of each wafer 13. In such a case, the shield 706 effectively prevents the ceiling surface of the reaction chamber 700 from being undesirably reacted with the reaction gases.

However, the reaction gases may be undesirably introduced into the gap between the shield 706 and the ceiling surface of the reaction chamber 700 and may undesirably form a thin film on the ceiling surface. In order to overcome such a problem, inert gases are introduced into the gap between the shield 706 and the ceiling surface of the reaction chamber 700, thus preventing an undesirable inflowing of the reaction gases into said gap. The nozzle, provided for ejecting the insert gases into the gap between the shield 706 and the ceiling surface of the reaction chamber 700, is designated by the reference numeral 708 in FIG. 5. As shown in the drawing, the reaction chamber 700 is provided with the inert gas supply pipe 708 in addition to two reaction gas supply pipes 709a and 709b used for supplying two different reaction gases into the reaction chamber 700. When insert gases are ejected into the gap between the shield 706 and the ceiling surface of the reaction chamber 700 from an inert gas ejection nozzle 708, it is possible to prevent the reaction gases from being undesirably introduced into the gap between the shield 706 and the ceiling surface of the reaction chamber 700 or from undesirably forming a thin film on the ceiling surface.

FIG. 5 also shows the second chamber heater 705b, which is installed at the upper portion within the reaction chamber 700 and heats the upper portion of the reaction chamber 700 at a desired constant temperature. This second chamber heater 705b is a cartridge-type heater, which is radially set in the upper portion of the reaction chamber 700. The first chamber heater 705a is not shown in FIG. 5, but it is well known to those skilled in the art from FIG. 4a that the first chamber heater 705a consists of a plurality of cartridge-type heaters that are regularly and vertically set on the cylindrical sidewall of the reaction chamber 700. Due to the first and second chamber heaters 705a and 705b, it is possible to keep the temperature of the reaction chamber 700 at an appropriate temperature suitable for performing a desired thin film vapor deposition process.

FIG. 6 is a plan view, showing the halogen lamp heater used for heating the wafers 13 seated on the susceptor 100.

As shown in the drawing, a plurality of halogen lamps are concentrically installed under the susceptor 100 while commonly affecting the wafer stations. In such a case, the halogen lamps are controlled independently and are divided into two groups 702a and 702b and are separately controlled in their temperatures, thus transferring desired uniform temperature heat to all the wafers seated on the susceptor 100. That is, it is almost impossible to uniformly heat the entire area within the reaction chamber 700 using a single group of heaters since the interior of the chamber 700 is too large. Therefore, it is necessary to divide the wafers into two groups and to uniformly heat the wafers of the two groups while separately controlling the temperatures of the two groups of halogen lamps.

Figure 7A:
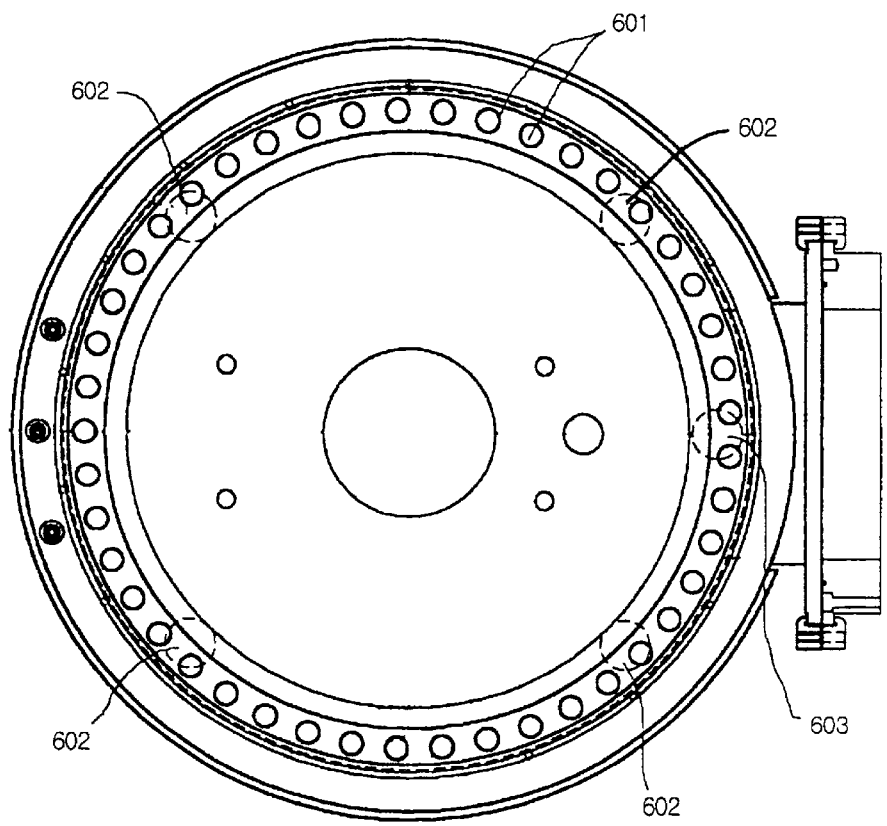
FIG. 7a is a transverse sectional view of the reaction chamber, showing the construction of a pumping unit included in the thin film deposition apparatus according to the present invention.
Figure 7B:
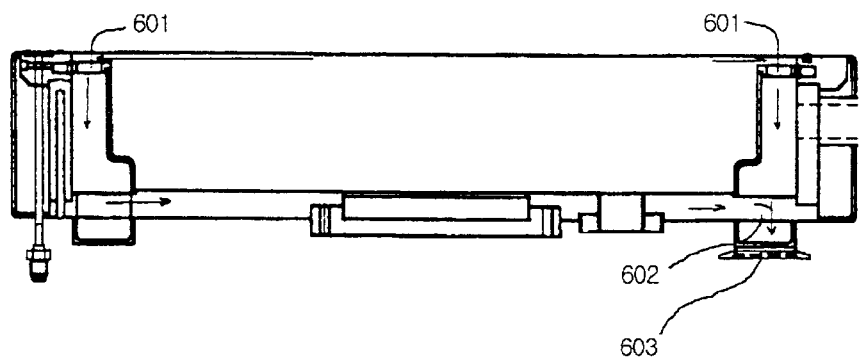
FIG. 7b is a longitudinal sectional view of the reaction chamber, showing the construction of the pumping unit of this invention.

FIGS. 7a and 7b are a transverse sectional view and a longitudinal sectional view of the pumping unit, which is included in the thin film deposition apparatus of this invention and is used for discharging the reaction gases from the reaction chamber to the outside of the chamber. As shown in the drawings, a plurality of primary pumping holes 601 are formed at the peripheral portion within the upper portion of the reaction chamber 700 and primarily discharge post-process reaction gases from the interior of the chamber 700 after the reaction gases are used for the vapor deposition process of forming desired thin films on the reaction surfaces of the wafers. In such a case, it is necessary to regularly form a plurality of primary pumping holes 601 at the peripheral portion within the upper portion of the reaction chamber 700 so as to uniformly discharge the post-process reaction gases from the positions corresponding to the wafers held on the susceptor 100.

The primarily discharged reaction gases from the primary pumping holes 601 are collected by four second pumping holes 602, which are formed at positions under the bottom of the reaction chamber 700, prior to being secondarily discharged. The secondarily discharged reaction gases are, thereafter, collected by one main pumping hole 603 due to pumping force of a vacuum pump (not shown) installed outside the reaction chamber 700 and are finally discharged to the outside of the reaction chamber 700.

In a brief description, post-process reaction gases within the reaction chamber 700 are primarily discharged from the interior of the chamber 700 through the primary pumping holes 601 at a constant speed, and are secondarily discharged through the four second pumping holes 602, and finally discharged to the outside of the reaction chamber 700 through one main pumping hole 603 due to the pumping force of the vacuum pump. The vacuum pumping unit 600 thus maintains the pressure of the reaction gases within the reaction chamber 700 at a predetermined pressure, and maintains the interior condition of the reaction chamber 700 at a low vacuum state expected from the chamber 700 before the vapor deposition process.

In the present invention, it is possible to change the numbers of the primary and second pumping holes 601 and 602 as desired without affecting the functioning of this invention. In addition, it is more preferable to symmetrically install a sufficient amount of pumping holes 601 and 602 capable of uniformly and effectively discharging such post-process reaction gases from the interior of the reaction chamber 700 to the outside of the chamber 700.

Figure 8:
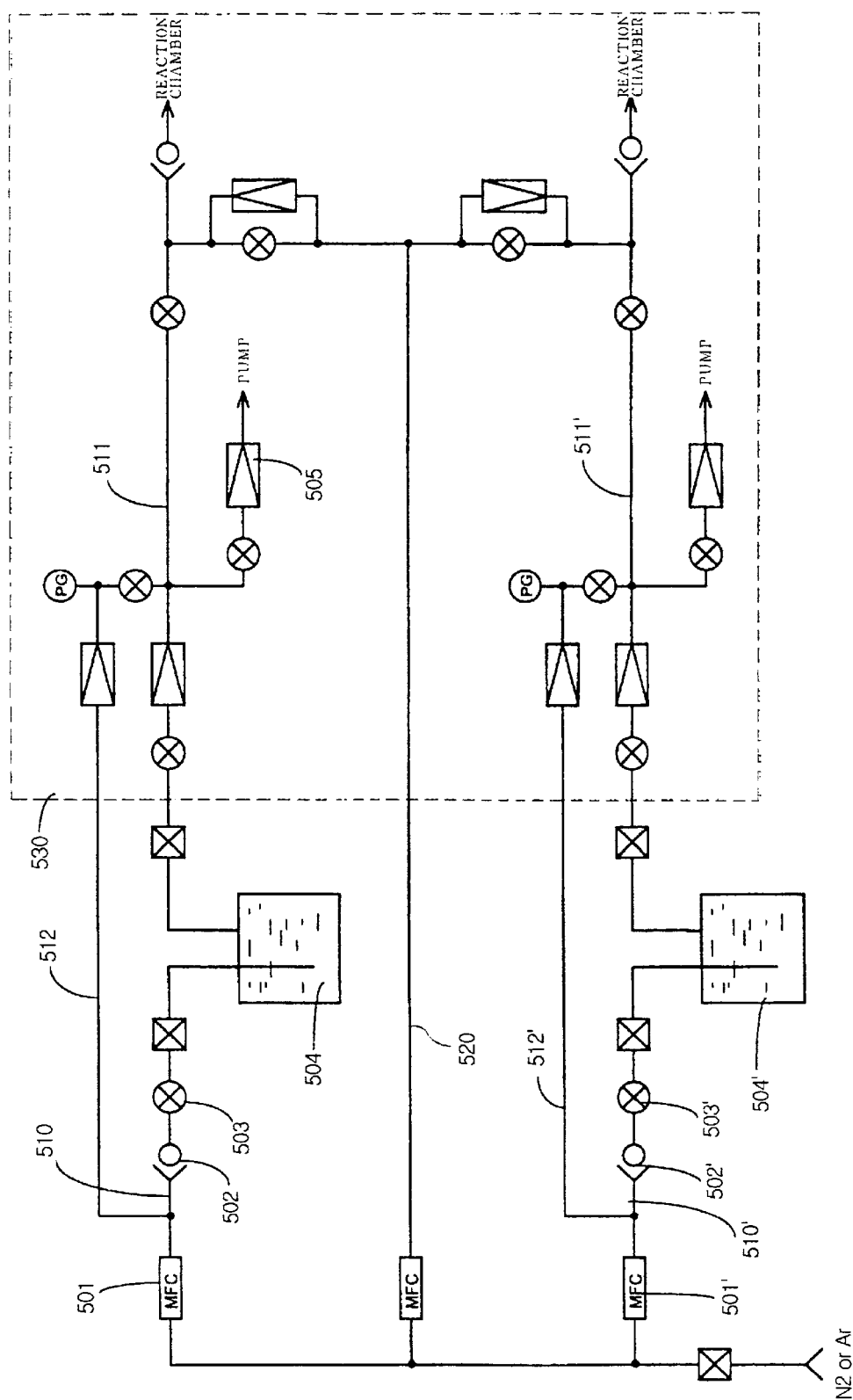
FIG. 8 is a circuit diagram of a gas feeding unit included in the thin film deposition apparatus according to the present invention.

FIG. 8 is a circuit diagram of the gas feeding unit 500, which is included in the thin film deposition apparatus of this invention and feeds reaction gases to the gas ejection unit, thus allowing the gas ejection unit to eject the reaction gases into the reaction chamber 700. As shown in the drawing, the gas feeding unit 500 comprises first and second gas feeding pipelines individually provided with a gas inlet pipe: a first pipe 510 or a second pipe 510'. The first pipeline is provided with a container for a first liquid reaction gas source 504, while the second pipeline is provided with a container for a second liquid reaction gas source 504'. An inert gas, such as $N_2$ or Ar, is introduced into the containers of the first and second liquid reaction gas sources 504 and 504' through mass flow controllers 501 and 501', check valves 502 and 502' designed to allow only a unidirectional flow of gases, and pneumatic valves 503 and 503' controlling the flow of gases.

In such a case, the inert gas is introduced into the reaction chamber through a carrier pipe 520 in addition to first and second gas inlet pipes 510 and 510'. The carrier pipe 520 extends from the integrated inlet of both gas inlet pipes 510 and 510' to the integrated outlet of both gas outlet pipes 511 and 511'. The inert gas, introduced into the containers of the first and second liquid reaction gas sources 504 and 504', forms gas bubbles within the containers, thus allowing the reaction gases to flow from the containers into the reaction chamber through first and second gas outlet pipes 511 and 511'. The inert gas, flowing in the carrier pipe 520, is mixed with the reaction gases just before the reaction gases are introduced into the reaction chamber.

Inert gas, flowing in the first gas inlet pipe 510, is branched from the pipe 510 into a first branch pipe 512 before it is introduced into the container of the first reaction gas source 504. The first branch pipe 512 joins the first gas outlet pipe 511, thus selectively feeding the inert gas into the reaction chamber or discharging the inert gas into a pump. In the same manner, inert gas, flowing in the second gas inlet pipe 510', is branched from the pipe 510' into a second branch pipe 512' before it is introduced into the container of the second reaction gas source 504'. The second branch pipe 512' joins the second gas outlet pipe 511', thus selectively feeding the inert gas into the reaction chamber or discharging the inert gas into a pump. In such a case, the discharging of inert gas into a pump is performed to control pressures of reaction gases flowing from the containers.

In the present invention, the gas feeding unit 500 is automatically controlled in accordance with a preset program to allow the containers of first and second liquid reaction gas sources 504 and 504' to alternately supply reaction gases into the reaction chamber. Therefore, when first reaction gas flows in the first gas outlet pipe 511 during an operation of the gas feeding unit 500, both the second gas inlet pipe 510' and the second gas outlet pipe 511' are so controlled by a plurality of valves that they do not allow a flow of both the inert gas and the second reaction gas.

The object of the first and second branch pipes 512 and 512', respectively branched from the first and second gas inlet pipes 510 and 510', is as follows. That is, when one of the first and second gas outlet pipes 511 and 511' does not allow a flow of reaction gas through it, inert gas is allowed to flow in an associated one of the first and second branch pipes 512 and 512', thus purging the interior of an associated one of the first and second gas outlet pipes 511 and 511' extending to the reaction chamber.

Such an automatic selective flowing of the inert gas or reaction gas in the pipes of the gas feeding unit 500 is accomplished by appropriately controlling both the check valves 502 and the pneumatic valves 503. In such a case, both the check valves 502 and the pneumatic valves 503 are sequentially controlled in accordance with a preset program. Such a sequential control for both the check valves 502 and the pneumatic valves 503 is well known to those skilled in the art and further explanation is thus not deemed necessary.

As shown in FIG. 8, an orifice 505 is mounted on each pipe extending to a pump so as to control the flow rate of gas within the pipe. Such an orifice 505 thus finally keeps desired constant pressure and flow rate of reaction gas or of inert gas inflowing into the pump through the pipe. In addition, the portion within the rectangle formed by a dotted line is a pipe heating part 530, which preheats the inflowing gases for the reaction chamber to a temperature of about 150° C.

The reaction gases, introduced into the reaction chamber by the above-mentioned gas feeding unit 500, are uniformly ejected onto the wafers seated on the susceptor through the gas ejection unit 701 of FIGS. 9a and 9b.

As described above, the present invention provides an apparatus for deposition of thin films on a plurality of wafers within a sealed reaction chamber, which automatically performs a desired vapor deposition process of forming thin films on the wafers. The apparatus also has a means for uniformly ejecting gases into the reaction chamber, thus lengthening the expected life span of the reaction chamber, and is designed to alternately feed reaction gases into the reaction chamber, thus appropriately controlling the quality of thin films formed on the wafers as desired. The apparatus is provided with a purging function at its gas supply unit, and independently controls the temperature of a wafer heating unit at two parts, thus uniformly heating the wafers. In the apparatus, heaters are provided at the upper and side portions within the reaction chamber, thus optimally controlling the reaction atmosphere within the reaction chamber and allowing the reaction chamber to effectively perform the desired vapor deposition process of forming the thin films on the wafers.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. An apparatus for deposition of thin films on a plurality of wafers through an atomic layer epitaxial process within a sealed reaction chamber, comprising:

a susceptor provided within said reaction chamber to hold the wafers thereon, said susceptor consisting of a plurality of wafer stations installed within said reaction chamber and used for holding the wafers respectively thereon such that reaction surfaces of said wafers are exposed to the interior of the reaction chamber, and a plurality of wafer seating units provided in said wafer stations respectively while penetrating the stations and being movable upward and downward in a vertical direction relative to the stations so as to seat the wafers in the wafer stations;

a gas ejecting unit provided at an upper portion within said reaction chamber and adapted for ejecting reaction gases onto the reaction surfaces of said wafers within the reaction chamber;

a gas feeding unit maintaining a predetermined temperature of the gases and feeding the reaction gases to said gas ejecting unit at predetermined time intervals so as to allow the gas ejecting unit to alternately eject the reaction gases into the reaction chamber;

a susceptor drive unit adapted for rotating said susceptor at a predetermined velocity and vertically moving the susceptor to an upper optimal reaction position close to a ceiling of said reaction chamber;

a vacuum pumping unit adapted for maintaining pressure of the reaction gases within the reaction chamber at a predetermined pressure, and discharging the reaction gases from the reaction chamber to the outside of said reaction chamber;

a wafer heating unit positioned at a position under the susceptor within the reaction chamber, and used for heating the wafers held on the susceptor at a predetermined constant temperature; and a reaction chamber heating unit consisting of a plurality of chamber heaters regularly set within said reaction chamber in a radial direction, and heating the interior of the reaction chamber at a predetermined constant temperature.

2. The apparatus according to claim 1, wherein said wafer seating unit comprises:

a lift plate having a flat upper surface;

a plurality of wafer moving pins assembled with said lift plate and regularly spaced apart from each other at predetermined angular intervals, said wafer moving pins commonly coming into contact with one wafer; and a lift plate drive unit mounted to said lift plate so as to move the lift plate in a vertical direction.

3. The apparatus according to claim 1, wherein said gas feeding unit comprises:

a first gas feeding pipeline, consisting of a first container receiving a first liquid reaction gas source, a first gas inlet pipe introducing inert gas into said first container, a first gas outlet pipe discharging reaction gas formed by an evaporation of the first liquid reaction gas source reacted with the inert gas introduced into the first container, and a first branch pipe branched from the first gas inlet pipe and joining the first gas outlet pipe; and a second gas feeding pipeline, consisting of a second container receiving a second liquid reaction gas source, a second gas inlet pipe introducing inert gas into said second container, a second gas outlet pipe discharging reaction gas formed by an evaporation of the second liquid reaction gas source reacted with the inert gas introduced into the second container, and a second branch pipe branched from the second gas inlet pipe and joining the second gas outlet pipe.

4. The apparatus according to claim 3, wherein each of said first and second gas outlet pipes is branched into a pipe extending to the reaction chamber and another pipe extending to a pump, with a pipe heating part being provided in each of said first and second gas outlet pipes for preheating the pipe, extending to the reaction chamber, to a predetermined temperature.

5. The apparatus according to claim 3, wherein a plurality of check valves and pneumatic valves are mounted on the first and second pipelines at positions between the first gas inlet pipe and the first container, between the first gas outlet pipe and the reaction chamber, between the second gas inlet pipe and the second container, and between the second gas outlet pipe and the reaction chamber, with a gas pressure controlling orifice being mounted at a position between each of the first and second gas outlet pipes and an associated pump.

6. The apparatus according to claim 3, wherein a carrier pipe extends from an integrated inlet of the first and second gas inlet pipes to an integrated outlet of the first and second gas outlet pipes so as to directly feed the reaction gases into the reaction chamber.

7. The apparatus according to claim 6, wherein said gas supply unit is controlled to allow the reaction gases of the first and second gas outlet pipes to be alternately ejected into the reaction chamber.

8. The apparatus according to claim 6, wherein when any one of the first and second gas outlet pipes does not allow a flow of reaction gas through it, inert gas flows in an associated one of the first and second branch pipes, thus purging the interior of an associated one of the first and second gas outlet pipes extending to the reaction chamber.

9. The apparatus according to claim 1, wherein said wafer heating unit comprises a plurality of halogen lamp heaters concentrically installed on a surface of the susceptor, said halogen lamp heaters being controlled independently; and an inert gas ejection unit installed at a position around the halogen lamp heaters to intermittently eject inert gas to the halogen lamp heaters, thus preventing an undesirable surface contamination of the halogen lamp heaters.

* * * * *